US007148949B2

(12) United States Patent
Teunissen et al.

(10) Patent No.: US 7,148,949 B2
(45) Date of Patent: Dec. 12, 2006

(54) LITHOGRAPHIC APPARATUS AND DEVICE MANUFACTURING METHOD

(75) Inventors: Francis.cus Johannes Herman Maria Teunissen, Rotterdam (NL); Antonius Johannes Van der Net, Tilburg (NL); Willem Lock, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 58 days.

(21) Appl. No.: 10/659,709

(22) Filed: Sep. 11, 2003

(65) Prior Publication Data

US 2004/0105080 A1 Jun. 3, 2004

(30) Foreign Application Priority Data

Sep. 13, 2002 (EP) ................................. 02256421

(51) Int. Cl.
*G03B 27/42* (2006.01)

(52) U.S. Cl. ............................ 355/53; 355/67; 355/72; 355/75; 430/311; 430/322; 250/492.1; 250/492.2; 250/548

(58) Field of Classification Search ..................... None
See application file for complete search history.

(56) References Cited

U.S. PATENT DOCUMENTS 6,522,384 B1 2/2003 Miwa
6,638,672 B1 * 10/2003 Deguchi ...................... 430/30
6,710,845 B1 * 3/2004 Wu et al. ..................... 355/53
2002/0083409 A1 6/2002 Hamm
2003/0035087 A1 2/2003 Murayama

FOREIGN PATENT DOCUMENTS

EP 1 143 491 A1 10/2001
EP 1 160 839 A2 12/2001
JP 9-306825 11/1997
JP 11-202496 7/1999
JP 2001-189268 7/2001

* cited by examiner

*Primary Examiner*—D. Rutledge
(74) *Attorney, Agent, or Firm*—Pillsbury Winthrop Shaw Pittman LLP

(57) ABSTRACT

In a purge gas system for a lithographic apparatus, a rate of flow of purge gas to the system is reduced substantially once a contamination level has fallen below a threshold level. The control may be on the basis of a detected level of contamination or on the basis of a timetable.

20 Claims, 4 Drawing Sheets

LA
Ex
IL
AM
IN
CO
PB
MT
MA
M2
M1
C
W
P1
P2
PL
RF
WT
IF
Z
X
Y 33
35
C1
34
31
C2
32
36
37

44
42
C1
43
45
41

53
54
55
52
C1
51
C2
56
57

62
63
64
C1
61
C2
65
66

LITHOGRAPHIC APPARATUS AND DEVICE MANUFACTURING METHOD

CROSS-REFERENCE TO RELATED APPLICATION

This application claims priority to European Patent Application No. 02256421.5, filed Sep. 13, 2002, the entire contents are hereby incorporated by reference.

BACKGROUND OF THE INVENTION

1. Field of the Invention

The present invention relates generally to lithographic projection apparatus and more particularly to such apparatus including a purge gas system.

2. Description of the Related Art

In general, a lithographic projection apparatus can be understood to include a radiation system for supplying a projection beam of radiation, a support structure for supporting patterning means, the patterning means serving to pattern the projection beam according to a desired pattern, a substrate table for holding a substrate, a projection system for projecting the patterned projection beam onto a target portion of the substrate, and a compartment surrounding a part of a path of the projection beam. In particular, many such devices include purging means for purging said compartment with a purge gas.

The term "patterning means" or "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

In a lithographic apparatus it is typically necessary to control the atmosphere in a beam path, and other components of the apparatus, for various reasons. In the beam path, it is important to control contaminants that might react with or deposit on optical elements and also to avoid absorption of the projection beam by the atmosphere in the beam path. The latter requirement becomes especially important in lithographic apparatus using exposure radiation of wavelengths of 157 nm or less, which are strongly absorbed by air. Thus, it is known to purge the beam path of apparatus with a purge gas such as clean air or other gases. In the case of apparatus using exposure radiation of wavelengths of 157 nm or less, it is known to purge the beam path with a purge gas such as nitrogen ($N_2$), helium (He) or mixtures of these gases, gases that are substantially transparent to the radiation of the projection beam. However, gases of the necessary purity can be expensive and the consumption of purge gas, which generally flows continuously while the apparatus is in operation and in some cases even while the apparatus is not operating, can be substantial, e.g. 1000 l/min or 2000 l/min during an initial purge of the apparatus when first installed. Purge gas must be bought-in—even if only nitrogen is used the plant necessary to purify it from ambient air would be prohibitively large and expensive. The consumption of purge gas therefore can be a significant operating cost for a lithographic apparatus.

SUMMARY OF THE INVENTION

It is an advantage of an embodiment of the present invention to provide a lithographic projection apparatus, which has a reduced consumption of purge gas.

This and other advantages are achieved according to an embodiment of the invention in a lithographic apparatus as specified in the opening paragraph, characterized in that:

said purging means comprises a controllable flow restrictor in the input of the purge gas to said compartment and control means for controlling said flow restrictor to restrict flow of the purge gas when contamination in said compartment is below a threshold level.

By restricting a flow of purge gas when contamination in a compartment has fallen, a substantial saving in the consumption of purge gas can be achieved. The flow restrictor can be controlled on the basis of measurements of one or more contaminants, e.g. water, oxygen or hydrocarbons, in the compartment or the out-flowing gas to determine whether the contamination has been reduced to below a threshold level. Alternatively, the flow restrictor can be controlled on the basis of a timetable based on empirical data and/or theoretical calculations as to the amount of purging required to reduce contamination to below a threshold level. As used herein, a flow restrictor may be any one of or a combination of a valve, a flow restriction, a manifold, etc. used in the control of the flow of purge gas.

The flow restrictor may be adjusted to increase the flow of purge gas after a potentially contaminating event such as the lithographic apparatus being switched off for servicing or otherwise, mask exchange, substrate exchange, an interruption in the purge gas supply, contamination of the purge gas supply, or other unusual event.

The apparatus may include multiple compartments, in which case a flow restrictor may be provided in a common part of the supply of purge gas to each compartment, so that the flow to all compartments is controlled simultaneously, or a separate flow restrictor may be provided for each compartment, in which case the flow restrictors may be controlled separately or together.

Where the apparatus has multiple compartments, the purging means may comprise: a manifold; a pressure regulator for supplying purge gas to said manifold at a substantially constant pressure; a supply to each compartment including a flow restriction to determine a flow rate into that compartment; and an outlet from each compartment including a flow restriction to determine the over-pressure in that compartment, wherein said pressure regulator provides a sufficiently high flow resistance so that a pressure in said manifold remains substantially constant in spite of a variation in flow resistance with respect to said compartments. This arrangement ensures a stable flow and over-pressure in each compartment, without disturbances of the pressure/flow situation in the event of changes in the purge gas consumption in other compartments. It should be noted that this arrangement also provides advantages even when the overall flow of purge gas and the flow to individual compartments is maintained constant.

The compartment or compartments may include:

- a compartment in the space between the substrate table and a final element of the projection system;
- a compartment surrounding a chamber containing the projection system;
- a compartment surrounding an element of the projection system;
- a compartment in the space between the patterning means and the projection system;
- a compartment surrounding the support structure for the patterning means;
- a compartment surrounding a mask handling device;
- a compartment surrounding all or part of the radiation system; and/or
- a compartment for conveying the projection beam from a radiation source to the radiation system.

The purge gas system may further comprise: a first purifier for purifying purge gas; a first valve for controlling input of purge gas to said first purifier; a second purifier for purifying purge gas output by said first purifier, purge gas output by said second purifier being supplied to said compartment(s); a second valve for controlling a flow of gas between said first purifier and said second purifier; a contamination sensor for sensing a level of a contaminant in the flow of gas from said first purifier to said second purifier; and control means for shutting at least one of said first and second valves in the event that said sensor detects contamination in the flow of gas from said first purifier to said second purifier above a first purifier threshold level. Further, the second purifier may be adapted to reliably provide a purge gas output to less than another level of contamination, said another level being lower than the first purifier threshold level.

With this arrangement, the level of contamination in the purge gas supply to the compartment(s) can be provided at a level which can only be measured with a highly expensive sensor that requires expert use while only a much less sensitive sensor, capable of detecting only a much higher level of contamination, can be used. The second purifier is of a size and/or configuration such as to ensure that if the level of contamination in its input is kept below a level measurable by the contamination sensor, the level of contamination in its output will be at a much lower level. For example, the maximum tolerable level of contaminants in the purge gas supplied to the compartment may be a few parts per trillion (ppt). While a sensor capable of measuring such a contamination level is inordinately expensive, a sensor capable of detecting a contamination level of a few parts per billion (ppb) is relatively cheap and easy to operate. Thus, the second purifier is designed so that, if provided with input gas with a contamination level no greater than a threshold of the order of a few ppb, its output will have a contamination level no greater than the desired level of a few ppt. The second purifier has a capacity such that this low level of contamination can be reliably provided for a given period of time and also can prevent contamination breakthrough in the time taken to shut the input if there is a substantial rise in the contamination of the output from the first purifier. The second purifier is then replaced, but is simpler and cheaper than a sensor necessary to measure the extremely low contaminant level required in the compartment. Again, this arrangement also provides advantages even when the overall flow of purge gas and the flow to individual compartments are maintained constant.

According to a further aspect of the invention there is provided a device manufacturing method comprising the steps of:

- providing a substrate that is at least partially covered by a layer of radiation-sensitive material;
- providing a projection beam of radiation using a radiation system;
- using patterning means to endow the projection beam with a pattern in its cross-section;
- projecting the patterned beam of radiation onto a target portion of the layer of radiation-sensitive material, and
- purging a compartment of the apparatus with a purge gas;

characterized in that:

- a flow of the purge gas to the compartment is restricted using a controllable flow restrictor when contamination in the compartment has fallen below a threshold level.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

One or more embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
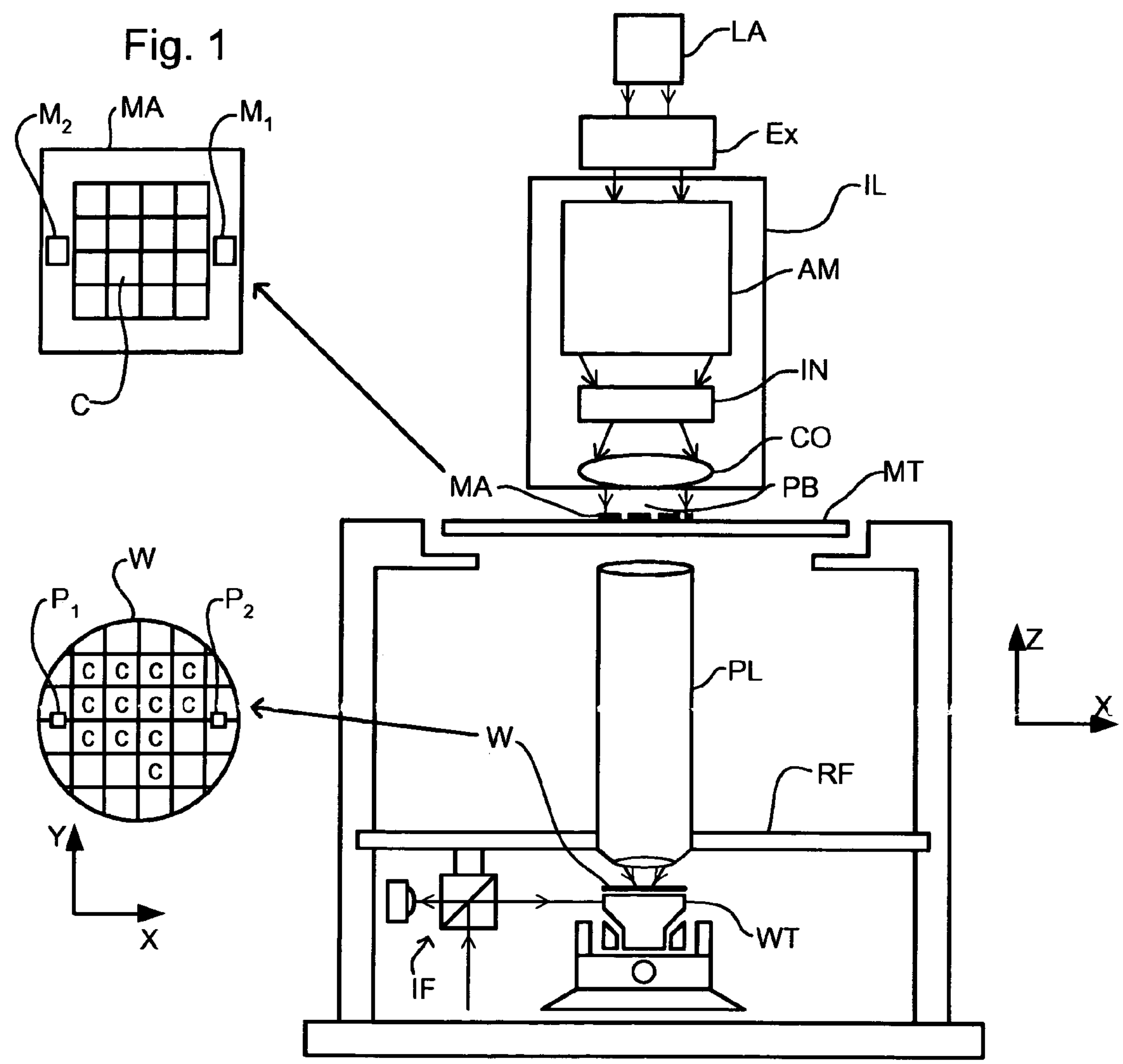
FIG. 1 depicts a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. DUV radiation), which in this particular case also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning means, such as a programmable mirror array of a type as referred to above.

The source LA (e.g., an excimer laser, lamp, plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
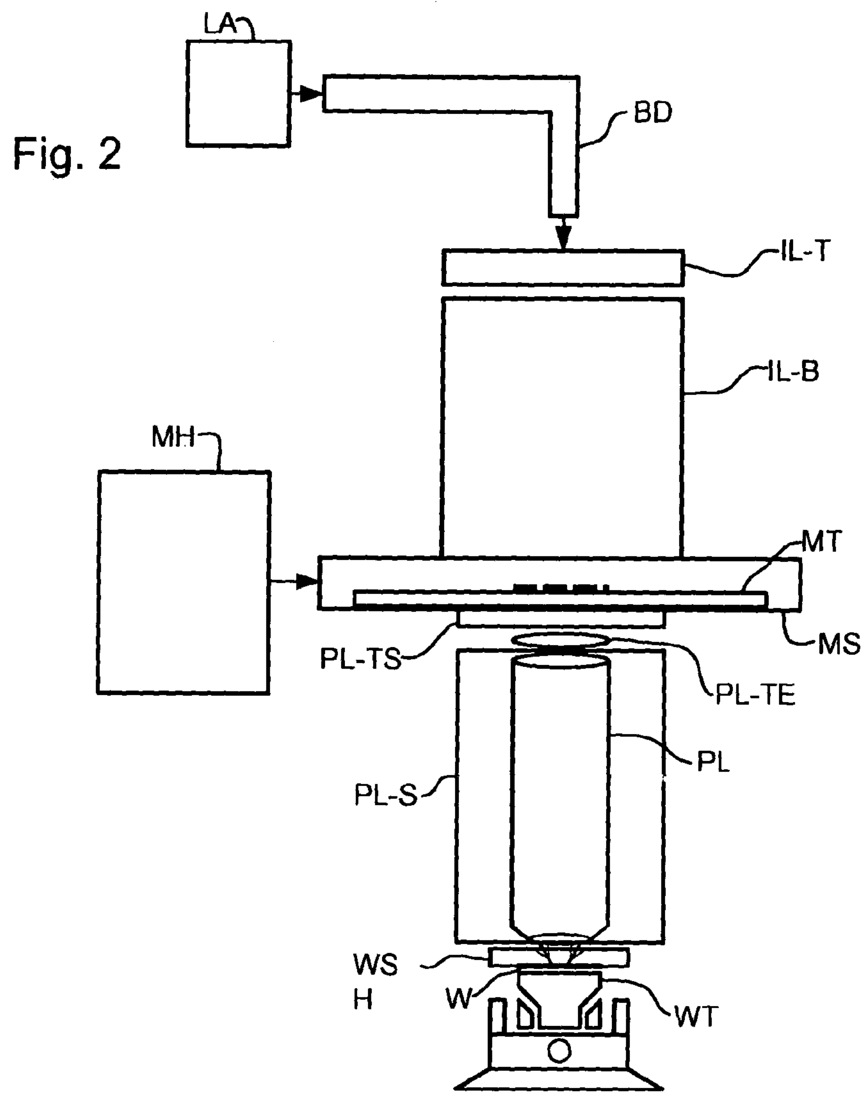
FIG. 2 depicts examples of different compartments in the apparatus of FIG. 1, which are supplied with purge gas.

FIG. 2 illustrates example compartments of a lithographic projection exposure apparatus, which are supplied with purging gas by a purging system, which will be described below with reference to FIG. 3. A first compartment that may be purged is the beam delivery pipe BD compartment, which brings exposure radiation from radiation source LA to the illumination system IL. The optical path length of the beam in the beam delivery pipe may be of the order of 10 m, since the radiation source if an excimer laser is often situated remotely from the remainder of the lithographic projection apparatus, and so potentially absorbing contaminants must be kept at a very low level in the beam delivery pipe BD. The illumination system IL is divided into top and bottom compartments IL-T, IL-B for convenience in maintenance of the apparatus and which are separately purged. The optical path length of the projection beam in these parts is also relatively long and hence a relatively low level of contamination must be maintained. The mask handling apparatus MH and mask stage MS are also separately compartmentalized; these parts will be opened for the interchange of masks relatively frequently and so must be completely purged relatively often. However, as the beam path through the mask stage is relatively short, a contamination level in this area does not need to be so low. The main part of the projection system PL is purged via a separate system with helium, whereas the remainder of the apparatus may be purged with nitrogen, or a gas mixture comprising mostly nitrogen. As will be apparent to those skilled in the art, different gases or gas combinations can be used and the gas or gas combination used for each compartment may be the same or different. A compartment surrounding the main part of the projection lens PL is purged with purge gas to form a projection system shield PL-S that ensures that any leakage into the projection lens is of less-absorbing and less-contaminating gas. The top element of the projection lens PL-TE is also compartmentalized and purged separately from the main part of the projection lens PL and a shield PL-TS is provided between the top ends of the projection lens PL-TE and the bottom of the mask stage MS. Finally, a wafer stage hood WSH is provided around the bottom of the projection lens PL, between it and the wafer W. As will be apparent, other and additional kinds of compartments may be provided or used.

Figure 3:
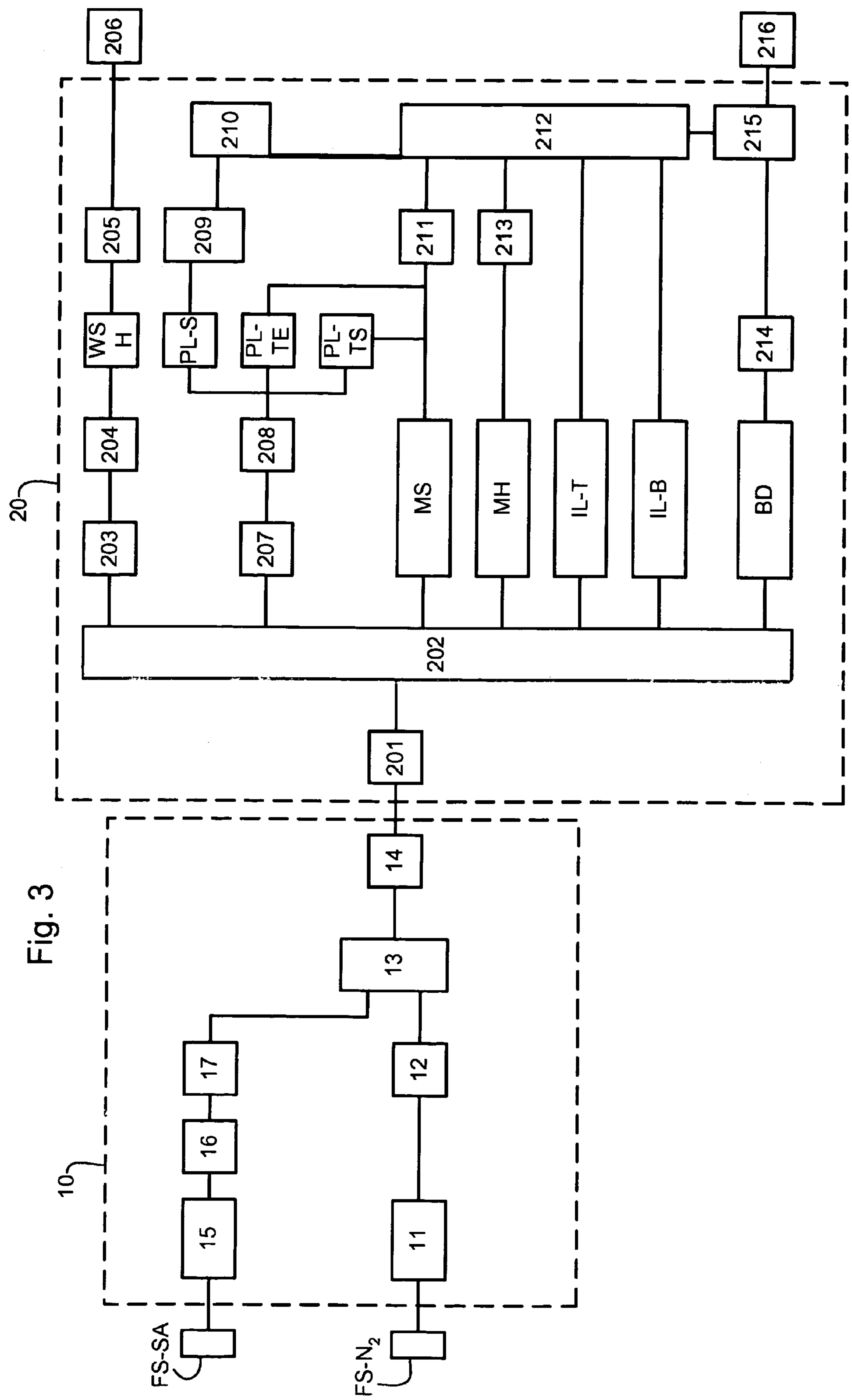
FIG. 3 depicts a purge gas supply system in the apparatus of FIG. 1.

Turning to FIG. 3, a main purge system, and its purge gas flow elements, will be described. A purge gas conditioning system 10 takes nitrogen and synthetic air from piped supplies FS-$N_2$, FS-SA provided in the fab (fabrication plant). The fab supply of nitrogen may provide "7N" nitrogen, that is 99.99999% pure nitrogen, at a pressure of 6 barg, that is 6 bar above atmospheric. A master input valve 11 controls the input of nitrogen to a purifier 12 which further purifies the input nitrogen to "9N" purity, that is 99.9999999% purity. The output of the purifier 12 is supplied to a passive mixer 13 (an active mixer may also be used) which receives synthetic air, that is a mixture of substantially pure nitrogen and substantially pure oxygen, via a valve 15, reducer 16 and restriction 17. This enables oxygen to be mixed into the pure nitrogen supply at a level of about 100 ppb of $O_2$ for cleaning purposes. The output of the passive mixer is supplied to a heat exchanger 14, which maintains the temperature of the purge gas within 1° K of a desired operating temperature. The purge gas output by the heat exchanger is supplied to the main purge gas distribution system 20.

Instead of using synthetic air other gas solutions are also conceivable. In particular purified compressed dry air appears to be an (economically) attractive alternative.

At the input of the main purge gas distribution system 20, a pressure regulator 201 reduces the pressure of the input gas to 3.5 barg and supplies it to a manifold 202. Separate supply lines then supply purge gas to each of the compartments identified in FIG. 2. The outputs from most of the different compartments are directed to output manifolds 210, 212 and 215 from which the used purge gas is safely and conveniently vented via an exhaust system 216.

The supply line to the projection system shield PL-S, projection lens top element PL-TE and projection lens top shield PL-TS compartments includes a further restriction 207 to control the rate of flow of purge gas to those systems as well as a heat exchanger 208 to maintain the purge gas at a constant temperature, since the projection lens is particularly sensitive to temperature variations. The outputs from the projection lens top element PL-TE, the projection lens top shield PL-TS, and the mask stage MS compartments go to the output manifold 212 via an output restriction 211 which maintains a desired over-pressure in those compartments. For similar reasons, output restrictions 209, 213, 214 are provided in the outputs from the projection system shield PL-S, the mask handling MH and beam delivery pipe BD compartments. The supply to the wafer stage hood WSH also includes a restriction 203 and heat exchanger 204 to minimize heat fluctuations in this part. An output restriction 205 is provided to maintain a desired over-pressure. Because the resist on the wafer is a major source of contaminants, e.g. particles ejected during an exposure, the output from the wafer stage hood is sent to a particle extractor 206 rather than to the main output manifold system 210, 212, 215.

According to an embodiment of the invention, when a contamination level in a compartment has been reduced to below a threshold level by the flow of purge gas, the rate of flow of gas to the manifold 202 is substantially reduced. Initially, the rate of flow of gas may be of the order of 1000–2000 l/min; after restriction the flow rate may be reduced to below 100 l/h, preferably about 60 l/h. In this way, the consumption of purge gas is substantially reduced. Apart from that, as in general the oxygen content should always remain above 19.5% in all compartments accesible to humans during purging, reducing the flow rate of the purge gas also helps in improving human safety, because the risk of oxygen depletion decreases.

The contamination level may include separate or combined criteria relating to oxygen, water and/or hydrocarbons. Further, the contamination level will typically be measured in parts per million or parts per billion. As will be apparent to those skilled in the art, any other contamination level criteria and measurements can be used. Further, the contamination level may be separately measured for each compartment, may be measured in a common flow element to a plurality of compartments, measured in a master compartment or flow element as a control for a plurality of other compartments, etc. As will be apparent, multiple contamination levels may be measured separately. For example, water and hydrocarbon contamination levels may be measured separately for a compartment or flow element.

The threshold level may be a predetermined value or may be configurable or adjusted during lithographic apparatus operation. The threshold level may encompass multiple and/or different levels for each of a plurality of contamination levels. For example, the flow of purge gas may be staged into different rates depending on different levels of contamination and according to different contaminants. Further, threshold levels may be separately provided for each compartment. Alternatively, the same threshold level may be provided for a plurality of compartments or flow elements. One or more threshold levels may be also be provided for a common flow element to a plurality of compartments, a master compartment or flow element as a control for a plurality of other compartments, etc.

As discussed above, the rate of flow of gas can be controlled on the basis of measurements of a contamination level, e.g. a contamination level for water, oxygen or hydrocarbons, in one or more compartments or one or more flow elements (such as the out-flowing gas) to determine whether contamination has been reduced to below a threshold level. Alternatively, the rate of flow of gas can be controlled on the basis of a timetable based on empirical data and/or theoretical calculations as to the amount of purging desired to reduce contamination to below a threshold level. Such a timetable may be predetermined or may be configurable or adjusted during lithographic apparatus operation.

In a variant (not illustrated) of the first embodiment, each of the supply lines to the different compartments is provided with an input restriction and an output restriction. The input restriction to each supply line is set to maintain a desired flow rate in that supply line while the output restriction is set to maintain a desired over-pressure. The input restriction to the manifold is then set so as to maintain a stable pressure in the manifold independent of any changes in purge gas consumption in any of the compartments.

Embodiment 2

Figure 4:
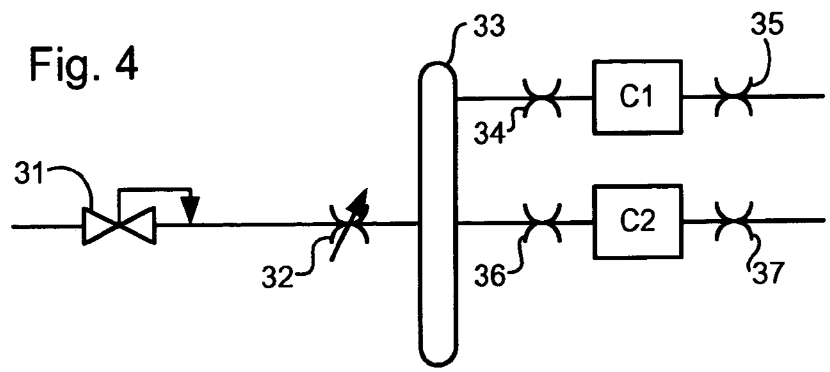
FIGS. 4 to 7 depict parts of a purge gas supply system in a lithographic apparatus according to an second to fifth embodiments of the invention respectively.

FIG. 4 is a diagram of part of the purge gas system showing an arrangement for restricting the flow of gas to the various compartments. The remainder of the second embodiment may be the same as the first embodiment.

In the second embodiment, a valve 31 provides a supply of purge gas at constant pressure. This purge gas is then input to the manifold 33 via a flow restriction 32 which controls the flow rate into the manifold according to a timetable, which is adapted to reduce the flow rate after a period of time sufficient to ensure that a contamination level in the various compartments C1, C2 which are purged have been reduced below a threshold level. Flow restrictions 34 to 37 in the inputs and outputs to the different compartments C1, C2 maintain the flow rates and over-pressures in these compartments at desired levels.

Embodiment 3

Figure 5:
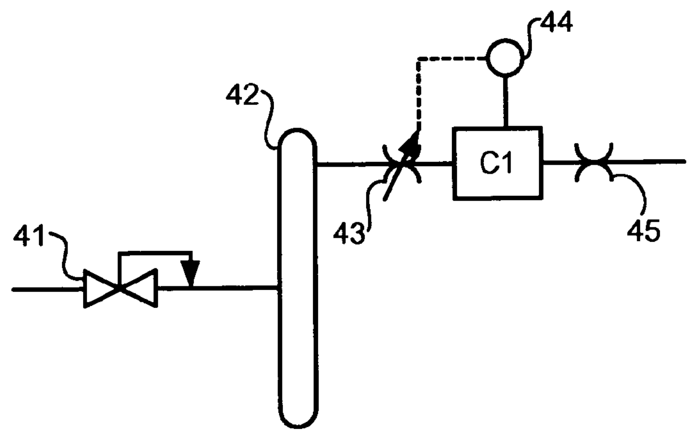

In a third embodiment, the flow rate is controlled on the basis of a measured contamination level and an arrangement for this is shown in FIG. 5. Otherwise, the embodiment may be the same as the first embodiment.

In FIG. 5, a supply of purge gas to the manifold 42 is maintained at a constant pressure by control valve 41. In the supply line to compartment C1 a flow restriction 43 is provided. This flow restriction is controlled on the basis of a level of contamination in compartment C1 measured by sensor 44. A flow restriction 45 in the output from compartment C1 maintains a desired over-pressure. Flow to other compartments (not shown in this Figure) may be controlled similarly, on the basis of respective contaminant sensors or as a function of time or slave to the flow control to a master compartment.

Embodiment 4

Figure 6:
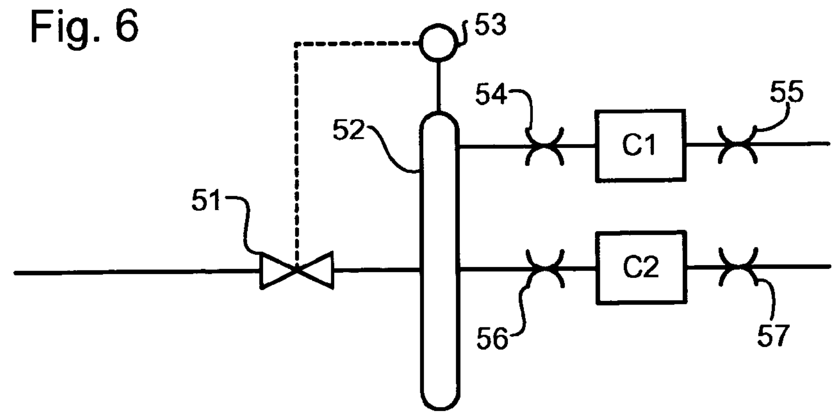

In a fourth embodiment, part of the purge gas supply system of which is shown in FIG. 6, the pressure of the supply of purge gas to a manifold is controlled on the basis of a detected contamination level. The fourth embodiment may be the same as the first embodiment, save as described below.

In a fourth embodiment, a contaminant sensor 53 is provided to measure a contamination level in the manifold 52. Contaminant sensors sensitive enough to detect contamination at maximum levels permitted in lithographic apparatus are complex and sensitive. It is believed that contamination levels in the various compartments of the system will be similar so that control can be effected on the basis of a contamination level measured in a master or common flow element, e.g. manifold 52, or a master or common compartment. An input valve 51 controls the pressure of the gas supply to the manifold 52 on the basis of a contamination level measured by sensor 53. Flow restrictions 54 to 57 are provided in the inputs and outputs to compartments C1, C2 to maintain desired flow rates and over-pressures therein.

Embodiment 5

Figure 7:
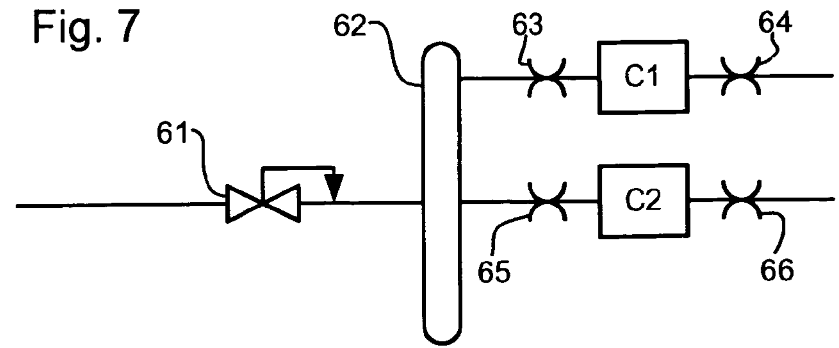

A fifth embodiment, part of the purge gas supply system of which is shown in FIG. 7, controls the pressure of the gas supply to the manifold as a function of time. Otherwise than described below, the fifth embodiment may be the same as the first embodiment described above.

In the fifth embodiment, a valve 61 controls the pressure of the gas supply to the manifold 62. The valve 61 is controlled via a control system (not shown) to reduce the pressure of the gas supply to the manifold according to a timetable to reduce the flow of gas once a contamination level in one or more of the compartments have dropped below a threshold level. Flow restrictions 63 to 66 in the supply lines to compartments C1, C2 define the flow rates and over-pressures in those compartments.

Pure Gas Supply System

Figure 8:
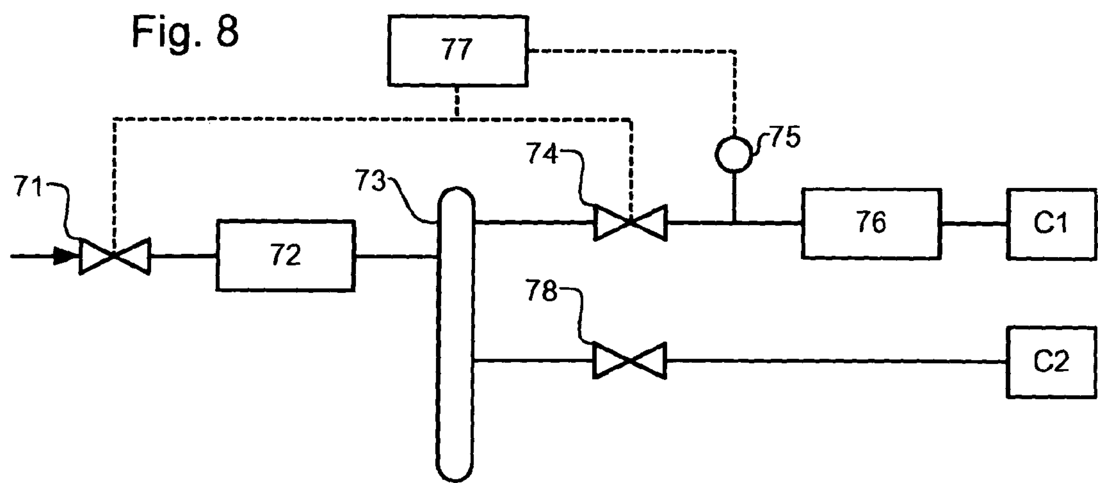
FIG. 8 discloses an arrangement for providing gas with a threshold contamination level useable in an embodiment of the invention.

FIG. 8 illustrates a system for supply of a pure gas or mixture of gases, which may be used in the embodiments described above. In the system shown in FIG. 8, an input valve 71 controls a supply of nitrogen gas from a supply provided in, for example, the fab. This gas is then sent to primary purifier 72, which supplies a manifold 73. The input gas to the system may be at a purity level of 7N, that is 99.99999% pure, while the output gas of the primary purifier 72 is at a purity level of 9N, that is 99.9999999% pure. A second control valve 74 controls the flow of gas from the manifold 73 to a secondary purifier 76, the output of which is supplied to one or more compartments C1 . . . (such as, for example, the compartments described earlier or the gas distribution system 20). Another control valve 78 controls the flow of gas to one or more compartments C2 . . . (such as, for example, the compartments described earlier or the gas distribution system 20) A sensor 75 measures a contamination level in the input gas to the secondary purifier 76. The sensor 75 may be a photo-ionization detector (PID) or flame-ionization detector (FID) which is capable of detecting a hydrocarbon contamination level in the parts per billion (ppb) range. The maximum acceptable level of hydrocarbon contamination in the purge gas supply system for one or more compartments C1 . . . however may be set in the parts per trillion (ppt) level. The secondary purifier is therefore designed and sized such that with an input gas having a contamination level no higher than that detectable by sensor 75, the output is reliably provided to be at the desired ppt level. Thus, provided the sensor 75 does not detect an out of specification contamination level for the input gas to the secondary purifier, the purge gas supplied to the one or more compartments C1 . . . can be reliably ensured to have the desired level of purity. In the event that an out of specification condition is detected, control valves 71 and 74 are shut via the control means 77 to protect the one or more compartments C1 . . . The secondary purifier 76 is also designed to reliably ensure that during the time taken for this shutdown a contaminant level in the gas supplied to one or more compartments C1 . . . does not rise above specified levels.

While specific embodiments of the invention have been described above, it will be appreciated that the invention may be practiced otherwise than as described. The description is not intended to limit the invention.

What is claimed is:

1. A lithographic projection apparatus comprising:

an illumination system to provide a projection beam of radiation;

a support structure to support a patterning structure, the patterning structure serving to pattern the projection beam according to a desired pattern;

a substrate table to hold a substrate;

a projection system to project the patterned beam onto a target portion of the substrate;

a compartment surrounding a part of a path of the projection beam; and a purge gas system to supply said compartment with a purge gas, said purge gas system comprising a controllable flow restrictor constructed operatively associated with, and constructed and arranged to supply purge gas to an inlet of said compartment and a controller constructed and arranged to control said flow restrictor to restrict a flow of purge gas through said inlet when contamination in said compartment is below a threshold level.

2. Apparatus according to claim 1 further comprising a sensor constructed and arranged to detect a level of a contaminant in the compartment or gas flowing out of said compartment and wherein said controller is responsive to an output of said sensor.

3. Apparatus according to claim 1 wherein said controller is adapted to control said flow restrictor on the basis of a timetable based on at least one of empirical data and theoretical calculations as to the amount of flow of purge gas desired to reduce contamination to below the threshold level.

4. Apparatus according to claim 1 configured such that a rate of supply of the purge gas to said compartment when the flow of gas is restricted is less than about 100 l/h.

5. Apparatus according to claim 1 wherein said controller is adapted to adjust the flow restrictor to increase the flow of purge gas after a potentially contaminating event.

6. Apparatus according to claim 5 wherein the potentially contaminating event is selected from the group consisting of: the lithographic projection apparatus being switched off, patterning structure exchange, substrate exchange, an interruption in purge gas supply, and contamination of the purge gas supply.

7. Apparatus according to claim 1, comprising a plurality of compartments configured to be supplied with purge gas and wherein said flow restrictor is provided in a common part of a supply of purge gas to each compartment, such that the flow to all compartments can be controlled simultaneously.

8. Apparatus according to claim 1 comprising a plurality of compartments configured to be supplied with purge gas and wherein separate flow restrictors are provided for respective ones of said compartments and wherein said controller is adapted to control said flow restrictors separately or together.

9. Apparatus according to claim 7 wherein said purge gas system further comprises:

a manifold;

a pressure regulator constructed and arranged to supply purge gas to said manifold at a substantially constant pressure;

a supply to each compartment including a flow restriction to determine a flow rate into that compartment; and an outlet from each compartment including a flow restriction to determine an over-pressure in that compartment, wherein said pressure regulator is configured to provide a sufficiently high flow resistance so that a pressure in said manifold remains substantially constant in spite of a variation in flow resistance with respect to said compartments.

10. Apparatus according to claim 1, wherein said compartment include at least one compartment selected from one or more of the following:

a compartment in the space between said substrate table and a final element of said projection system;

a compartment surrounding a chamber containing said projection system;

a compartment surrounding an element of said projection system;

a compartment in a space between said patterning structure and said projection system;

a compartment surrounding said support structure for said patterning structure;

a compartment surrounding a mask handling device;

a compartment at least partially surrounding said illumination system; and a compartment configured to convey said projection beam from a radiation source to said illumination system.

11. Apparatus according to claim 1 wherein said purge gas system comprises:

a first purifier;

a first valve constructed and arranged to control input of purge gas to said first purifier;

a second purifier, in fluid communication with an output of said first purifier, purge gas output by said second purifier arranged to be supplied to said compartment;

a second valve constructed and arranged to control a flow of gas between said first purifier and said second purifier;

a contamination sensor constructed and arranged to sense a level of a contaminant in the flow of gas from said first purifier to said second purifier; and a controller constructed and arranged to operate said first valve, said second valve, or both valves in the event that said sensor detects contamination in the flow of gas from said first purifier to said second purifier above a first purifier threshold level.

12. Apparatus according to claim 11 wherein the second purifier is adapted to reliably provide a purge gas output to less than another level of contamination, said another level being lower than a threshold level of said first purifier.

13. An apparatus according to claim 1, wherein the flow restrictor is located outside the compartment.

14. Apparatus according to claim 1, wherein said compartment is constructed and arranged to only surround said part of said path of the projection beam.

15. Apparatus according to claim 1, further comprising a sensor constructed and arranged to detect a level of a contaminant in (i) a flow element, (ii) a common flow element to a plurality of compartments, (iii) a master compartment or flow element as a control to a plurality of compartments, or (iv) any combination of (i)–(iii), as measure of contamination in said compartment and wherein said controller is responsive to an output of said sensor.

16. A device manufacturing method comprising:

projecting a patterned beam of radiation onto a target portion of a layer of radiation-sensitive material on a substrate in a lithographic projection apparatus, and purging a compartment of the apparatus with a purge gas, a flow of the purge gas through an inlet of the compartment being restricted using a controllable flow restrictor, to supply gas to said inlet, when contamination in the compartment has fallen below a threshold level.

17. A method according to claim 16 wherein said flow is restricted when a measured level of contamination in said compartment or of gas flowing out of said compartment falls below the threshold level.

18. A method according to claim 16 wherein said flow is restricted according to a timetable.

19. A method according to claim 16, wherein the gas flow restrictor is located outside the compartment.

20. A method according to claim 16, wherein said flow is restricted when a measured level of a contaminant in (i) a flow element, (ii) a common flow element to a plurality of compartments, (iii) a master compartment or flow element as a control to a plurality of compartments, or (iv) any combination of (i)–(iii), used as measure of contamination in said compartment, falls below the threshold level.

* * * * *